United States Patent
Tsuji

(10) Patent No.: US 6,806,506 B2
(45) Date of Patent: Oct. 19, 2004

(54) SEMICONDUCTOR DEVICE HAVING LEADS PROVIDED WITH INTERRUPTER FOR MOLTEN RESIN

(75) Inventor: Kazuyoshi Tsuji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/196,908

(22) Filed: Jul. 16, 2002

(65) Prior Publication Data

US 2003/0027372 A1 Feb. 6, 2003

(30) Foreign Application Priority Data

Jul. 17, 2001 (JP) .......................... 2001-217132

(51) Int. Cl.[7] .................. H01L 29/22; H01L 33/00; H01L 29/205; H01L 29/20; H01L 29/207
(52) U.S. Cl. .................. 257/99; 257/88; 257/91; 257/92; 257/93; 257/100
(58) Field of Search .................. 257/88, 89, 91, 257/92, 93, 99, 100

(56) References Cited

U.S. PATENT DOCUMENTS

| 4,146,883 A | | 3/1979 | Appeldorn et al. |
| 4,933,729 A | * | 6/1990 | Soejima et al. ............... 257/82 |
| 6,521,916 B2 | * | 2/2003 | Roberts et al. ............. 257/100 |
| 2003/0168670 A1 | * | 9/2003 | Roberts et al. ............... 257/98 |

FOREIGN PATENT DOCUMENTS

| JP | 6-216412 | * | 8/1994 |
| JP | 09-92888 | | 4/1997 |
| JP | 11-135839 | | 5/1999 |

* cited by examiner

*Primary Examiner*—Ngân V. Ngô
(74) *Attorney, Agent, or Firm*—Merchant & Gould P.C.

(57) ABSTRACT

A semiconductor device includes semiconductor elements, a housing for accommodating the semiconductor elements, a resin material arranged in the housing for enclosing the semiconductor elements, and leads connected to the semiconductor elements. Each lead is divided into two portions, that is, an inner portion embedded in the resin material and an outer portion protruding from the resin material. The outer portion of the lead is provided with an enlarged part having a barrier surface directed toward the resin material.

4 Claims, 14 Drawing Sheets

SEMICONDUCTOR DEVICE HAVING LEADS PROVIDED WITH INTERRUPTER FOR MOLTEN RESIN

BACKGROUND OF THE INVENTION

1. Field of the Invention

The present invention relates to a semiconductor device including a lead partially enclosed by a resin material. It also relates to a method of making such a semiconductor device.

2. Description of the Related Art

FIG. 12 of the accompanying drawings shows a conventional semiconductor device. The device, generally indicated by reference sign B, is an 8-segment display unit incorporating eight LED chips in a housing 90. The device B includes a plurality of leads 91 each of which has an outer end portion 92 to surface-mount the device.

The conventional device B is made in the following manner. First, as shown in FIGS. 13A and 13B, a liquefied resin material 93 is poured into the housing 90. Then, as shown in FIG. 13C, the LED chips 94 mounted on the leads 91 are immersed into the resin material 93. The outer end portions 91a of the leads 91 protrude from the resin material 93, and in this state the resin material 93 is hardened. Finally, the outer end portions 91a are subjected to bending and/or cutting procedures, to provide the surface-mounting terminals 92 shown in FIG. 12.

In the above manner, the LED chips 94 can be simply enclosed by resin, so that the production efficiency is advantageously improved. However, the conventional method has found disadvantageous in the following respect.

The leads 91 of the conventional device B are obtained by etching a metal plate 95. Specifically, as shown in FIG. 14A, a resist layer 96 provided with appropriate openings is formed on the upper and the lower surfaces of the plate 95. Then, as shown in FIG. 14B, isotropic etching is performed on the plate 95 from above and below. Since the etching is isotropic, it progresses laterally as well as vertically through the plate 95. Accordingly, the resultant leads 91 are formed, in their side surfaces, with grooves 91c.

As best shown in FIG. 15, the grooves 91c extend longitudinally of the leads 91. When the thus-grooved leads 91 are put into the resin 93 for executing the step shown in FIG. 13C, the liquefied resin 93 tends to rise along the grooves 91c by capillary action toward the extremity of the outer end portion 91a. As a result, most of the outer end portion 91a may be covered by the resin material, which is disadvantageous to soldering the end portion 91a to e.g. a printed circuit board.

SUMMARY OF THE INVENTION

The present invention has been proposed under the circumstances described above. It is, therefore, an object of the present invention to provide a method of fabricating a semiconductor device that does not suffer from the undesired covering of the terminals by the applied resin material in a molten state. Another object of the present invention is to provide a semiconductor device produced by such a method.

According to a first aspect of the present invention, there is provided a fabrication method of a semiconductor device. The method comprises the steps of: preparing a lead including an inner portion and an outer portion; connecting a semiconductor element to the inner portion of the lead; and immersing the semiconductor element and the inner portion of the lead into liquefied resin in a manner such that the outer portion of the lead, as a whole, protrudes from the liquefied resin. The outer portion of the lead is provided with an enlarged part for interrupting the flow of the liquefied resin along the lead, that is caused by the capillary action.

The method of the present invention may further comprise the step of putting the semiconductor element, together with the inner portion of the lead connected to the element, into place within a housing prepared for accommodating the element, the lead, etc.

The method of the present invention may further comprise the step of pouring the liquefied resin into the housing. The order of this resin-pouring step and the above-mentioned element-housing step may be interchangeable.

Preferably, the enlarged part may include a resin-interrupting surface directed toward the liquefied resin in which the semiconductor element and the inner portion of the lead are immersed.

Preferably, the lead may be prepared by etching a metal plate. As a result of the etching process, the lead may be formed with two side surfaces which have been processed by the etchant and are spaced from each other in the width direction of the lead. In this instance, the enlarged part may preferably protrude in the width direction of the lead so that it interrupts the resin flow along the above-mentioned two side surfaces. According to the present invention, the lead may also be prepared by punching a metal plate.

According to a second aspect of the present invention, there is provided a semiconductor device that comprises: a semiconductor element; a housing that accommodates the semiconductor element; a resin material arranged in the housing for enclosing the semiconductor element; and a lead that is connected to the semiconductor element and includes an inner portion embedded in the resin material and an outer portion protruding from the resin material. The outer portion of the lead is provided with an enlarged part including a barrier surface directed toward the resin material arranged in the housing.

Preferably, the outer portion of the lead may include a connection terminal that is farther from the resin material in the housing than the barrier surface is. With this arrangement, the barrier surface prevents the connection terminal from being covered by the resin material in a molten state during the fabrication procedure of the semiconductor device. Preferably, the connection terminal may be smaller in width than the enlarged part.

Preferably, the semiconductor element may be a light-emitting diode (LED), and the housing may be formed with an opening that allows the passage of the light emitted from the LED.

Other features and advantages of the present invention will become apparent from the detailed description given below with reference to the accompanying drawings.

DETAILED DESCRIPTION OF THE PREFERRED EMBODIMENTS

Preferred embodiments of the present invention will be described below with reference to the accompanying drawings.

FIGS. 1~4 illustrate an 8-segment display unit A according to a first embodiment of the present invention. The display unit A includes a housing 1, resin filling 2, eight LED chips 3 and ten leads 4.

Figure 1:
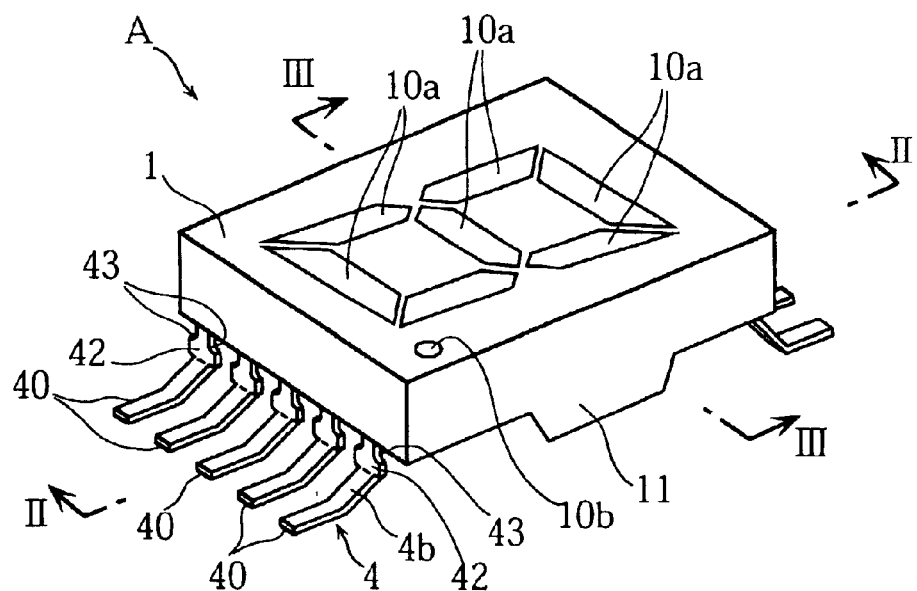
FIG. 1 is a perspective view showing an 8-segment display unit according to a first embodiment of the present invention.
Figure 2:
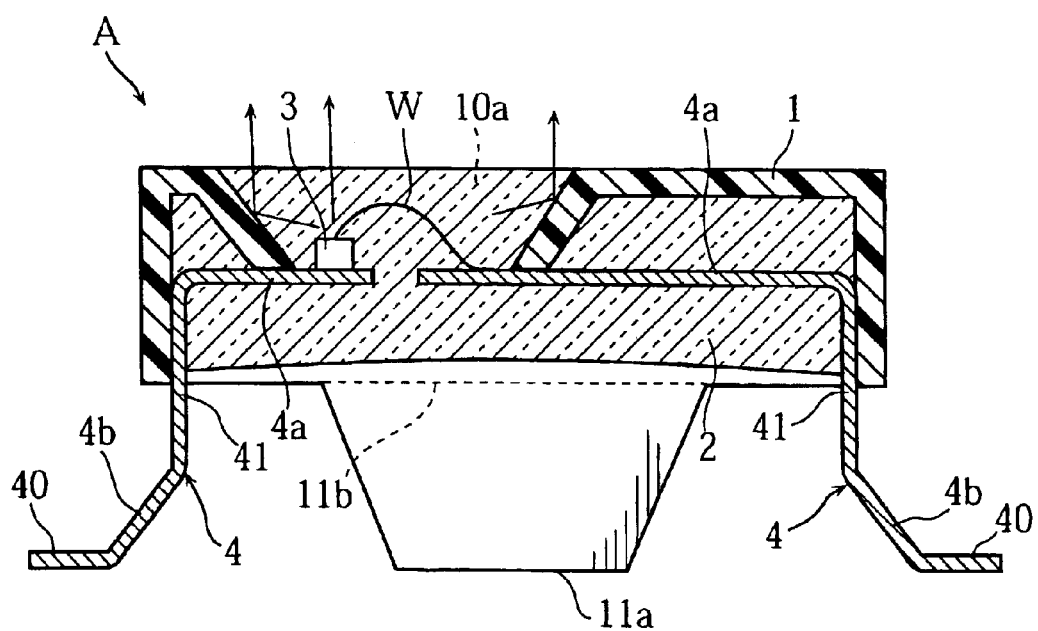
FIG. 2 is a sectional view taken along lines II—II in FIG. 1.

The housing 1, which may be made by a conventional resin-molding technique, includes a front wall (upper wall) provided with elongated openings 10a representing the number '8' and with a circular opening 10b representing a dot. The housing 1 also includes a pair of side walls 11 each provided with a trapezoidal projection tapering downward. As best shown in FIG. 2, the projection includes a bottom surface 11a parallel to an imaginary line 11b. With such an arrangement, the display unit A is mounted stably on e.g. a printed circuit board by bringing the bottom surface 11a of each projection in contact with the circuit board.

The filling 2 is a transparent resin such as epoxy, so that it allows the passage of light emitted from the LED chips 3. The resin filling 2 extends into the openings 10a, 10b of the housing's front wall. Such a configuration can be provided by pouring a liquefied resin material into the housing 1 and then hardening the supplied resin.

Figure 4:
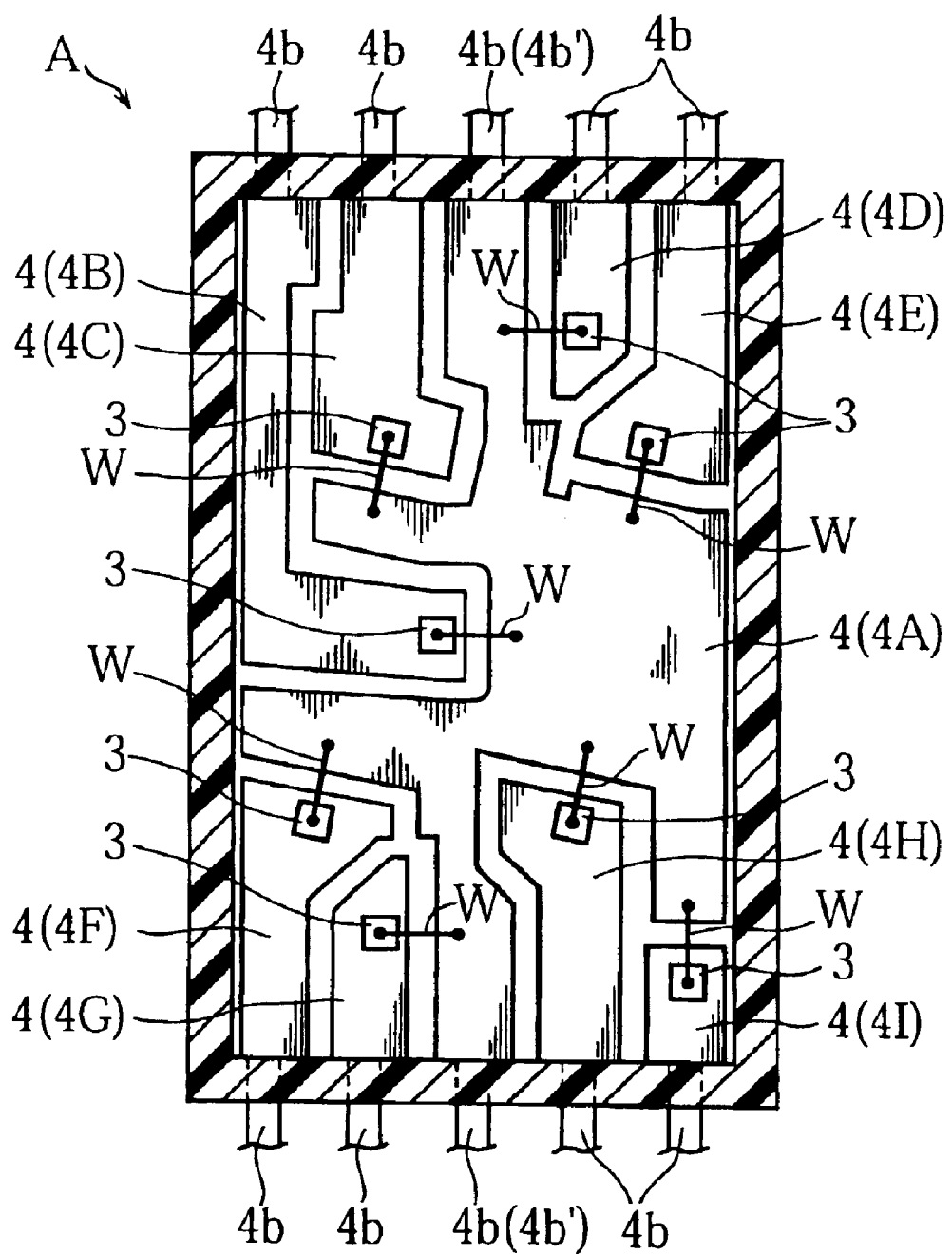
FIG. 4 is a plan view showing the inside layout of the leads of the device shown in FIG. 1.

The leads 4, produced from a "leadframe" as will be described later, are connected to the LED chips 3. As shown in FIG. 4, among the leads 4, a lead 4A is provided for grounding purposes and eight leads 4B~4I are provided for applying driving voltage. The ground lead 4A includes an inner portion embedded in the resin filling 2 and two outer portions 4b (or 4b') that protrude from the resin filling 2 in opposite directions. The other leads 4B~4I each include an inner portion 4a (see FIG. 2) embedded in the resin filling 2 and an outer portion 4b protruding from the resin filling 2.

Each of the eight LED chips 3, as shown in FIG. 4, is mounted on one of the eight leads 4B~4I in electrical connection thereto via a positive terminal (not shown) formed on the bottom surface of the chip. The negative terminals of the respective chips 3 are connected to the ground lead 4A via wires W. The chips 3 are disposed within the openings 10a or 10b of the housing 1. The chips 3 together with the wires W are enclosed by the resin filling 2.

Figure 3:
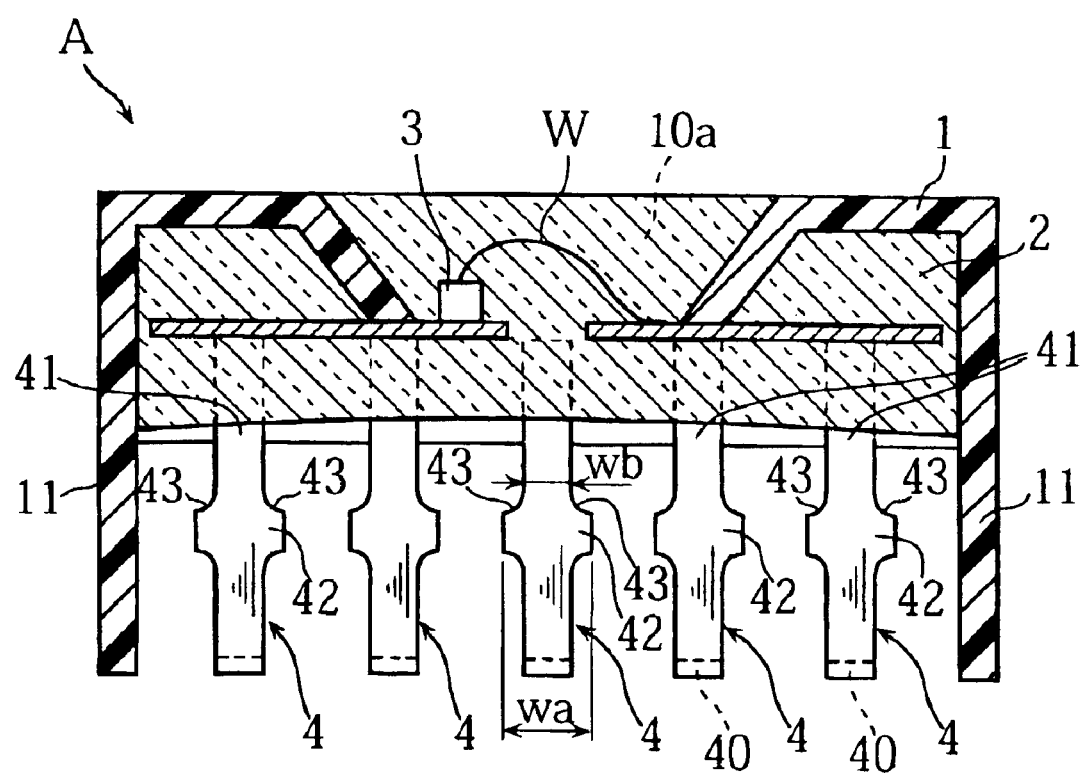
FIG. 3 is a sectional view taken along lines III—III in FIG. 1.

As best shown in FIG. 2, the outer portions 4b of the leads 4 (4A~4I) are bent so that their horizontal extremities 40 are flush with the bottom surfaces 11a of the side walls 11. As seen from FIGS. 1 and 3, each lead 40 is provided with an enlarged part 42 disposed between the extremity 40 and sprouting point 41 of the lead. As shown in FIG. 3, the enlarged part 41 has a width wa which is greater than the normal width wb of the outer portion 4b of the lead. The enlarged part 41 includes a pair of barrier surfaces 43 directed toward the resin filling 2. The barrier surfaces 43 may be curved as shown in FIG. 3, or flat where appropriate. The technical significance of providing the barrier surfaces 43 will be explained later.

The display unit A can be mounted onto a printed circuit board by e.g. reflow soldering. In operation, upon receiving the driving voltage via the leads 40, the eight LED chips 3 are selectively turned on so that a desired one of the numbers 0~9 or the dot is displayed. As shown in FIG. 2, the light emitted from an LED chip 3 is reflected outward by the peripheral wall of the housing's opening 10a, 10b. Such reflection is advantageous to providing bright display of the required number or the dot.

A method of fabricating the display unit A will now be described.

Figure 5:
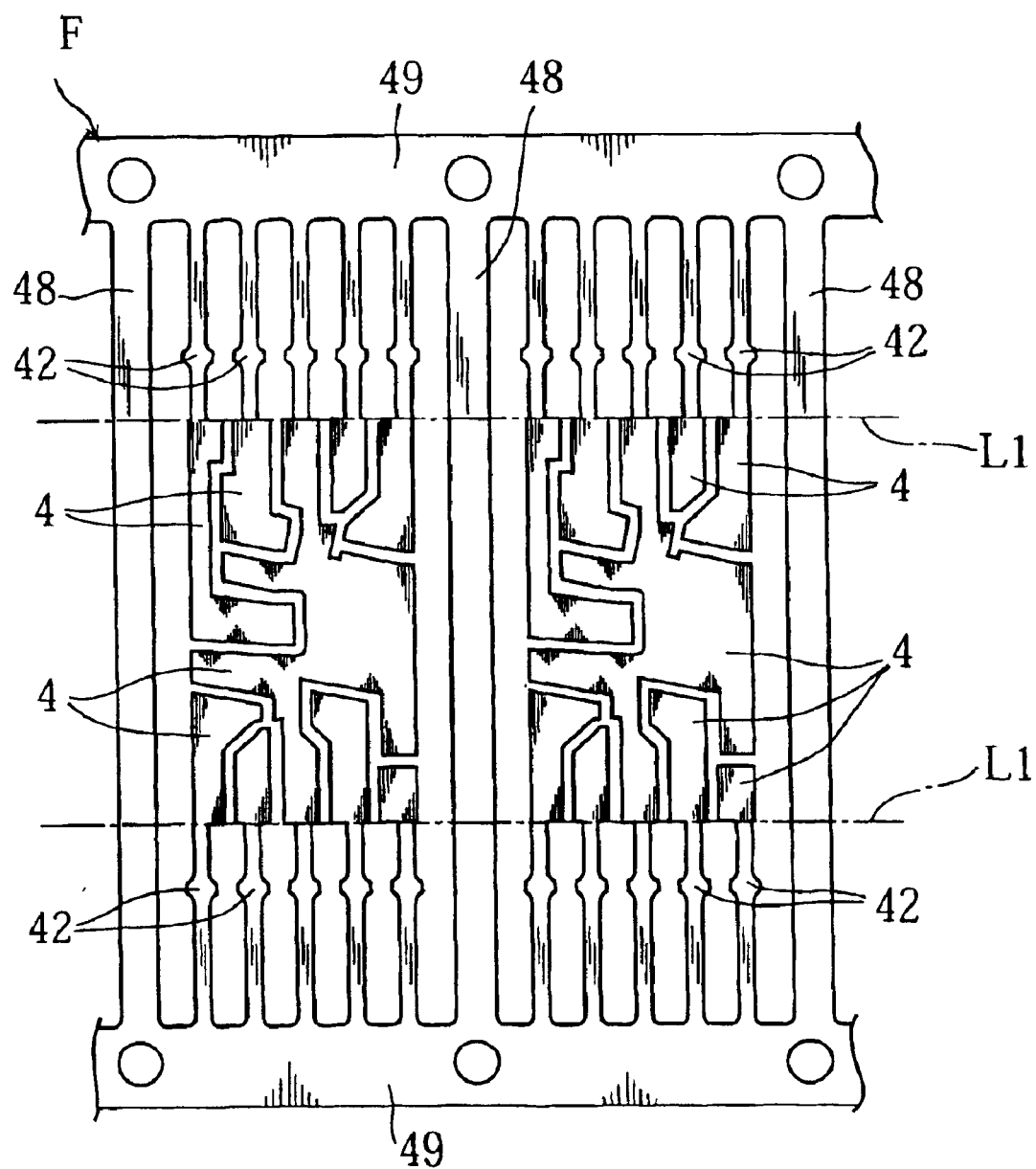
FIG. 5 is a plan view showing a part of a leadframe used for making the device shown in FIG. 1.
Figure 14A:
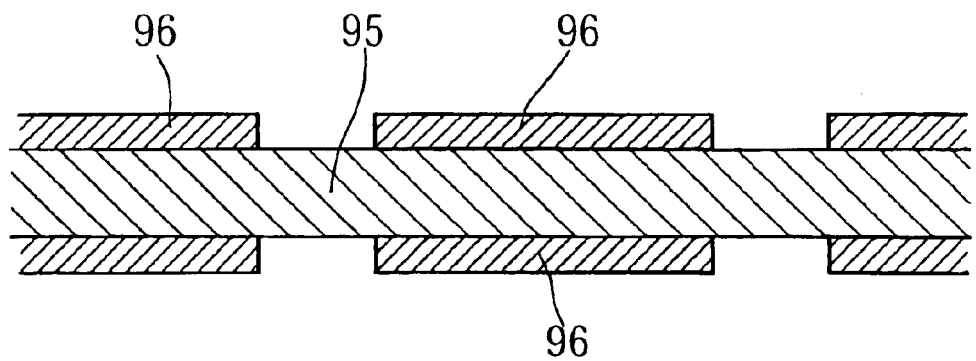
FIGS. 14A and 14B illustrate how a metal plate is processed into a conventional leadframe by etching.
Figure 14B:
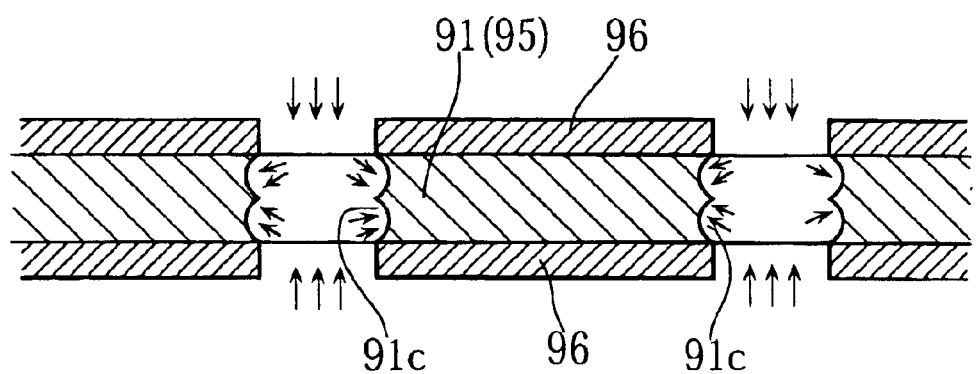
Figure 15:
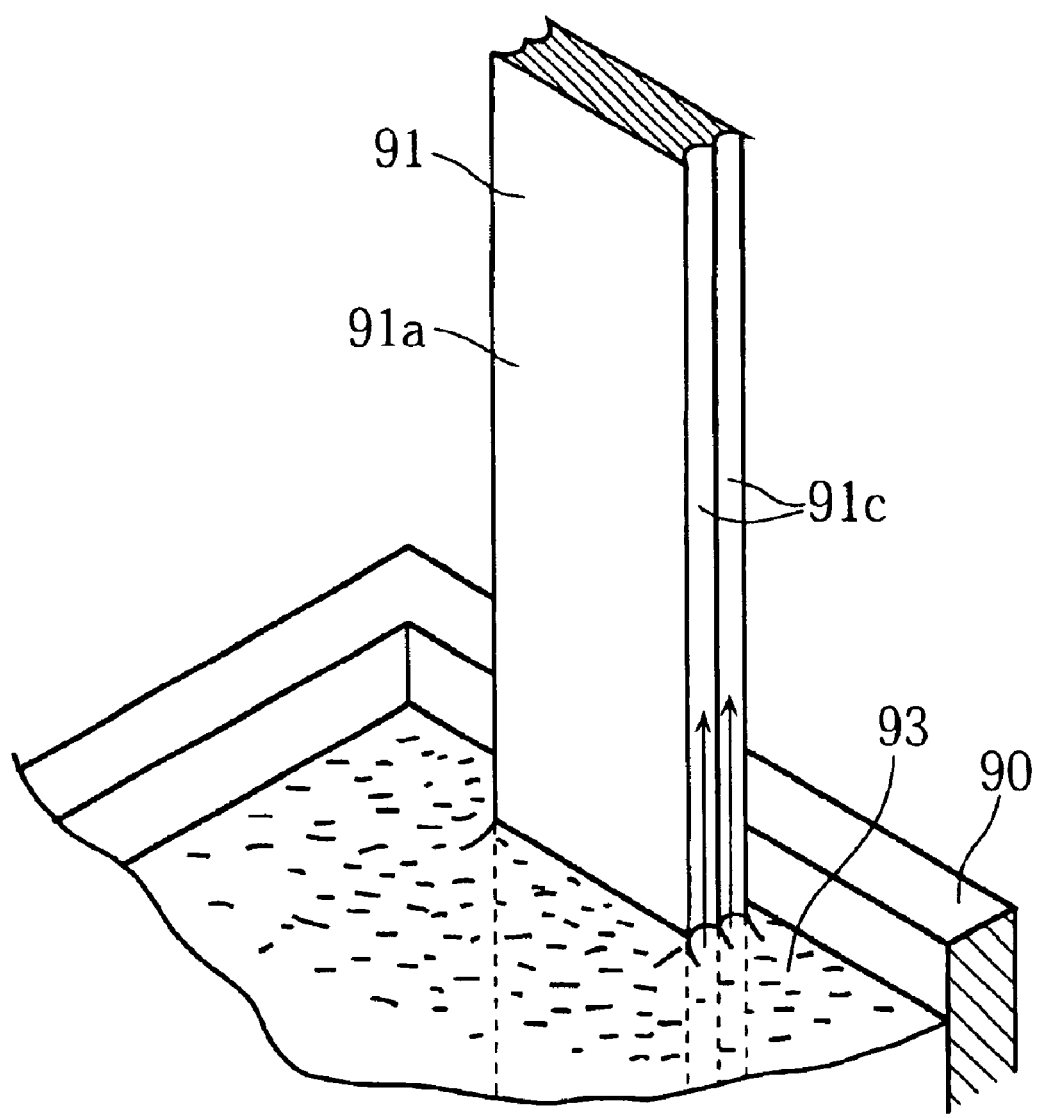
FIG. 15 illustrates the problem of the prior art.

FIG. 5 shows a leadframe F used for making the display unit A. The leadframe F is prepared by etching an elongated metal plate. The etching process is the conventional one as illustrated with reference to FIGS. 14A and 14B, so that no detailed explanation of it is given here.

The obtained leadframe F includes a pair of side strips 49 extending longitudinally of the leadframe, and a plurality of cross members 48 each extending perpendicularly to the side strips 49. Each cross member 48 is spaced from the adjacent counterparts by a prescribed distance. The leadframe F also includes a plurality of identical sets of leads 4. Each set of leads 4, as shown in FIG. 5, are provided between the adjacent cross members 48. Each lead 4 is formed with an enlarged part 42.

Figure 6A:
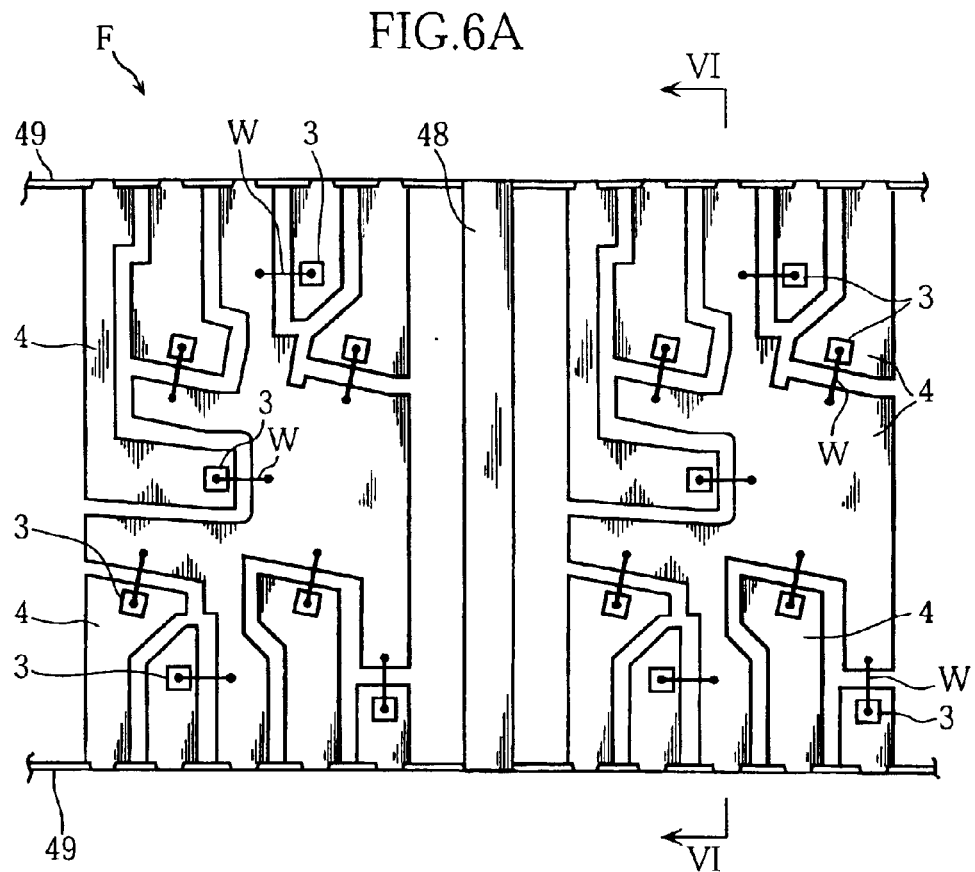
FIG. 6A is a plan view showing the leadframe with semiconductor chips and connection wires bonded thereto.
Figure 6B:
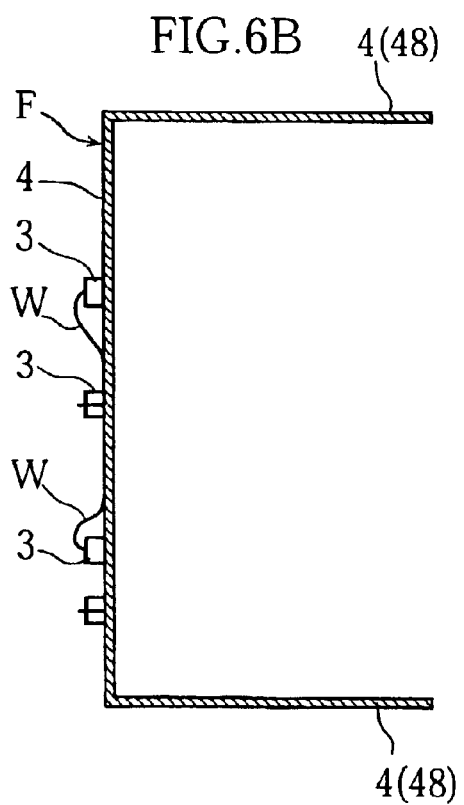
FIG. 6B is a sectional view taken along lines VI—VI in FIG. 6A.

Then, the leadframe F is bent along the prescribed bending lines L1 (FIG. 5). As a result, the leadframe F assumes the appearance shown in FIGS. 6A and 6B. In this state, as best shown in FIG. 6B, the leads 4 and the cross members 48 make right angles at their bent portions. After the leadframe bending is complete, the bonding of the LED chips 3 and wires W is performed. This order may be reversed.

Figure 7:
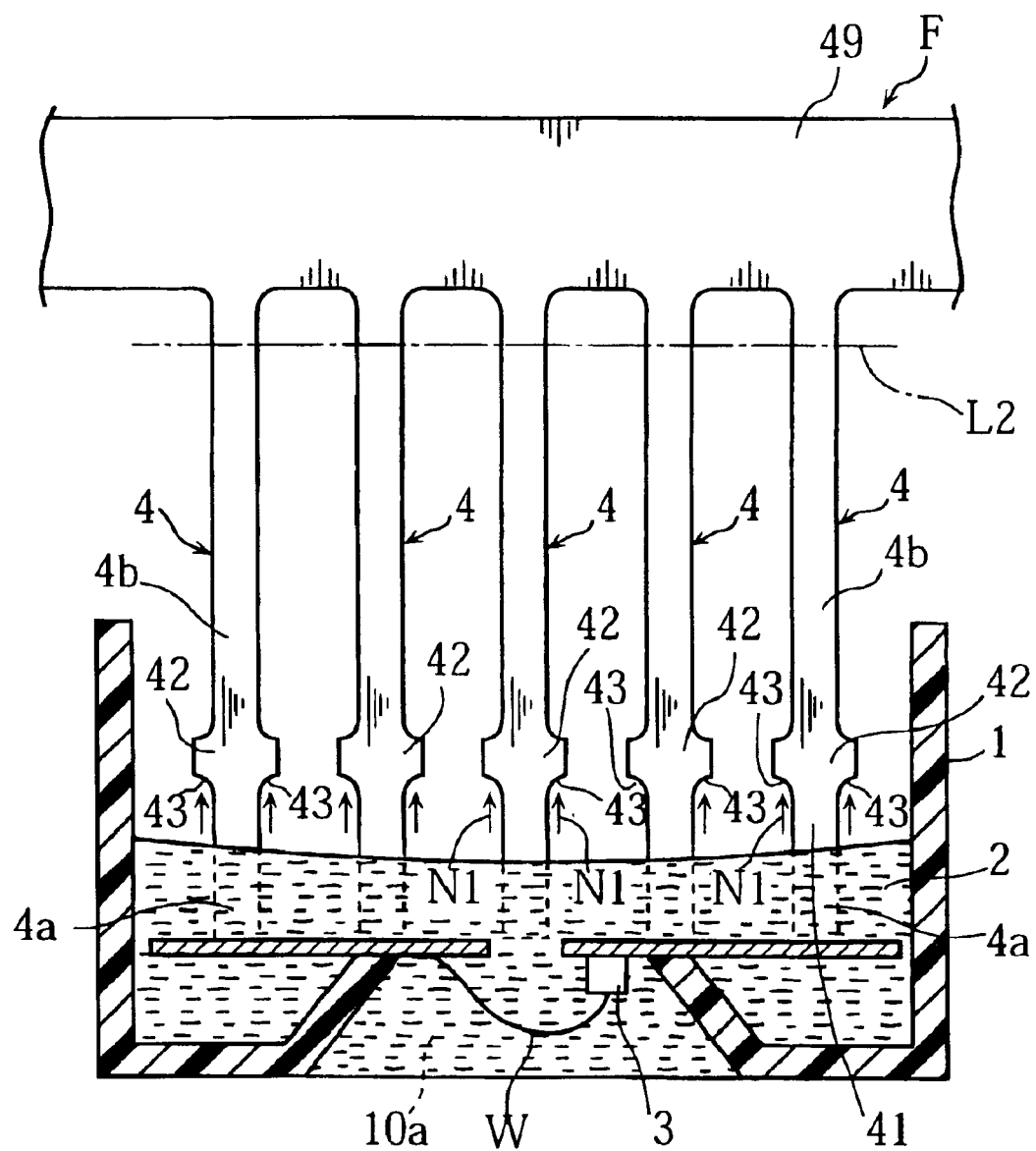
FIG. 7 illustrates a step of the fabrication procedure of the device shown in FIG. 1, where the bent leadframe shown in FIGS. 6A~6B is dipped into the liquefied resin contained in the housing of the device.

Then, as shown in FIG. 7, the housing 1 is turned upside down, with the openings 10a, 10b stopped for prevention of leakage, and then liquefied resin 2 is poured into the housing 1. The LED chips 3 mounted on the leads 4 are immersed into the resin 2. The enlarged parts 42 of the respective leads 4 should be kept above the liquefied resin 2. In this state, the liquefied resin 2 may rise along the upright portions of the leads 4 due to capillary action, as described with the prior art. Advantageously, however, the enlarged parts 42 of the leads 4 interrupt such a rising motion of the resin at the barrier surfaces 43. Thus, the upper portions of the leads 4 located above the enlarged parts 42 are not covered by the resin material.

According to the present invention, the pouring of the liquefied resin 2 may be performed after the leads 4 with the required components mounted thereon have been laid in place within the housing.

With the LED chips 3 and the predetermined portions of the leads 4 immersed in the resin 2, the resin 2 is hardened by heating. Thereafter, the leadframe F is cut along the cutting line L2 shown in FIG. 7, and finally the leads 4 are bent in the manner seen from FIG. 2. As described above, the extremities 40 of the leads 40 are not covered by resin material. Thus, the leads 40 can be properly soldered to a printed circuit board for example.

FIGS. 8~11 show other possible embodiments of the present invention. Throughout these figures, elements identical or similar to those of the above-described first embodiment are indicated by the same reference numerals or signs.

Figure 8:
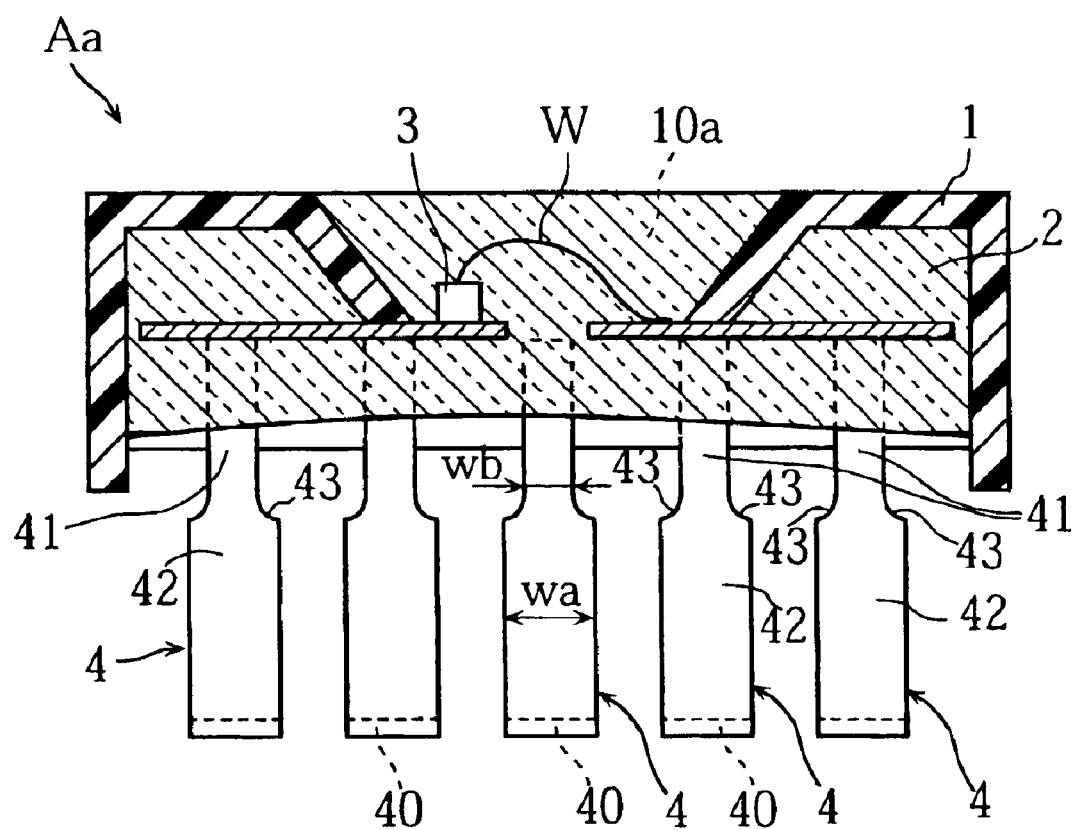
FIG. 8 is a sectional view showing the principal features of a semiconductor device according to a second embodiment of the present invention.

FIG. 8 shows the principal feature of a display unit Aa according to a second embodiment of the present invention. As seen from the figure, each of the leads 4 includes an outer portion 4b that is formed with a relatively narrow part (extending from the sprouting point 41) and a relatively wide part (enlarged part) 42, where the former has a smaller width wb and the latter has a greater width wa. With such an arrangement, the barrier surfaces 43 of each enlarged part 42 interrupt the rising of the liquefied resin material as shown in FIG. 7.

Figure 9:
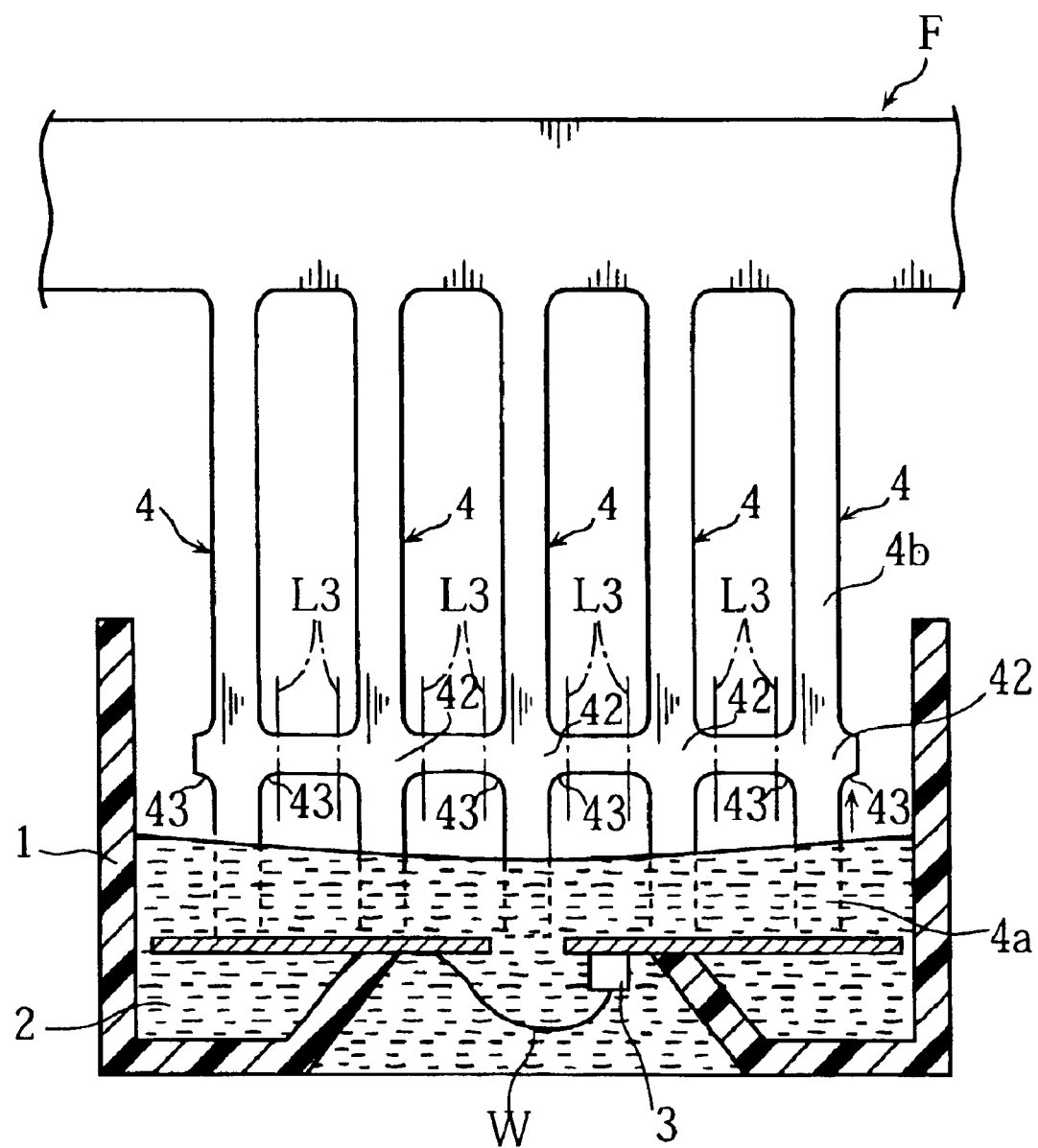
FIG. 9 illustrates a step of the fabrication procedure for a semiconductor device according to a third embodiment of the present invention.

FIG. 9 shows a step of the fabrication method for producing a display unit according to a third embodiment of the present invention. In this embodiment, the enlarged parts 42 of the leadframe F are connected to each other in the initial state. As in the previous embodiments, the rising of the resin material is interrupted by the barrier surfaces 43 at the respective enlarged parts 42. After the resin material is hardened, the connection of the enlarged parts 42 is cut along the cut lines L3.

Figure 10:
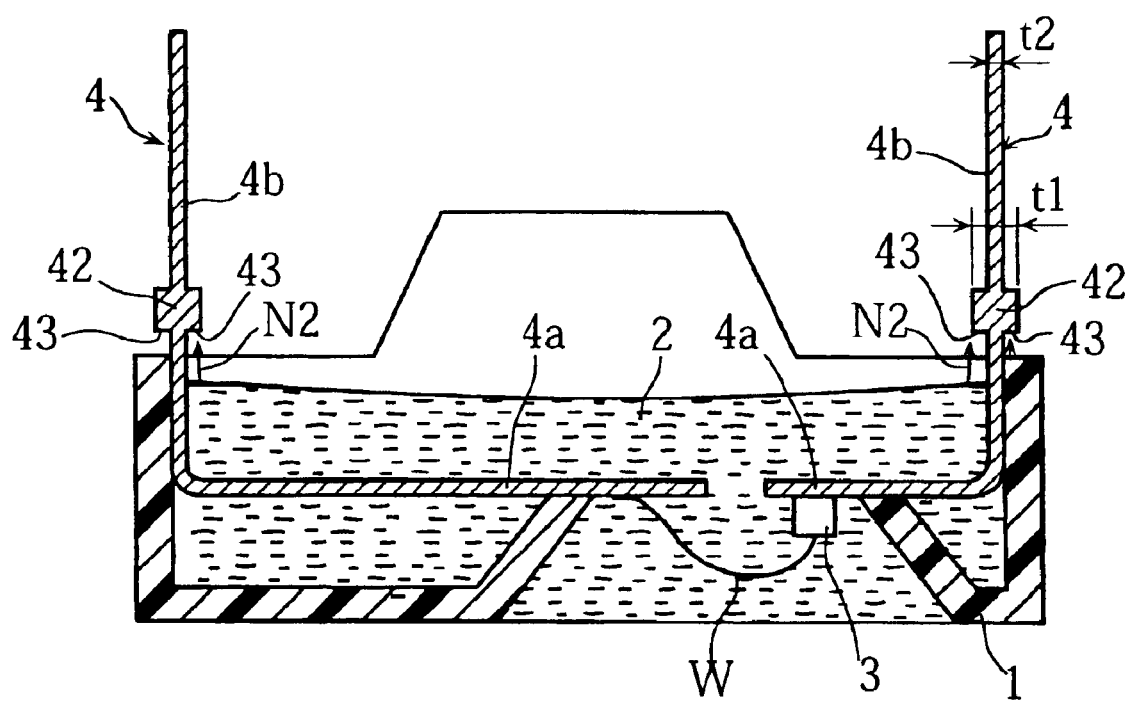
FIG. 10 illustrates the principal features of a semiconductor device according to a fourth embodiment of the present invention.

FIG. 10 shows a step of the fabrication method for producing a display unit according to a fourth embodiment of the present invention. The leads 4 of this embodiment include an enlarged part 42 whose thickness t1 (not the width; compare FIG. 6B) is greater than the thickness t2 of the other part of the outer portion 4b. The illustrated lead 4 may be prepared by punching a metal plate, and the barrier surfaces 43 of the enlarged part 42 are rendered flat, to project in the thickness direction of the lead 4.

As shown in FIG. 7 and FIG. 10, the enlarged part 42 of the present invention may project in the width direction or thickness direction, or both.

Figure 11:
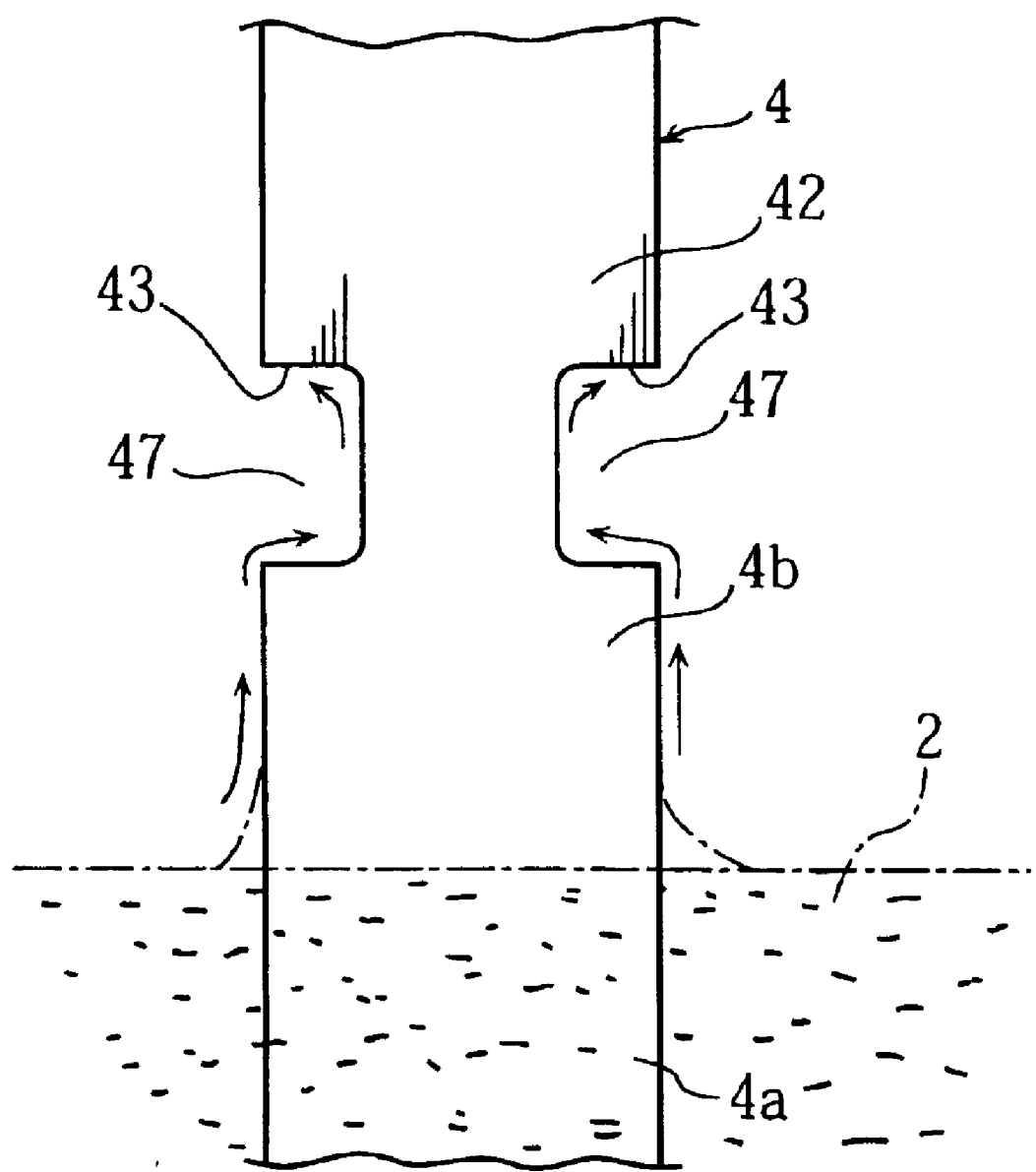
FIG. 11 is an enlarged view showing the characteristic configuration of a lead used for a semiconductor device according to a fifth embodiment of the present invention.
Figure 12:
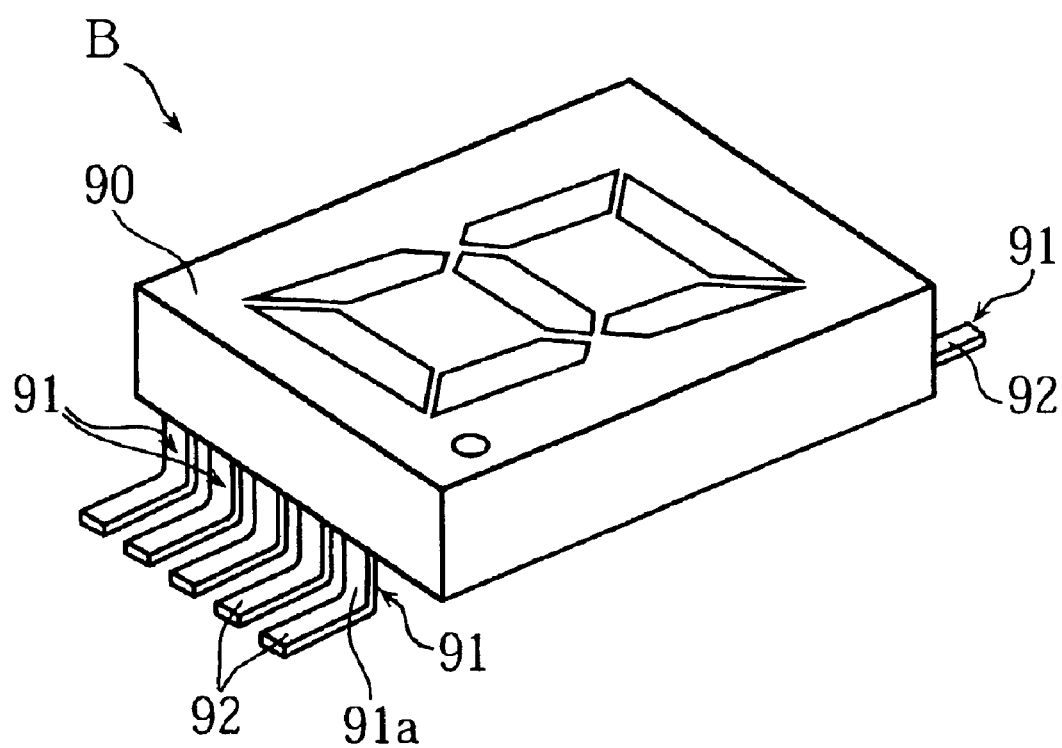
FIG. 12 is a perspective view showing a conventional display unit.
Figure 13A:
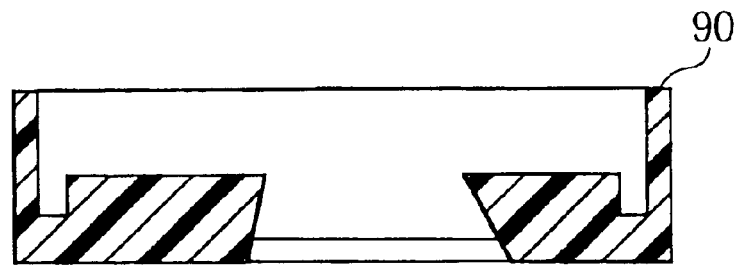
FIGS. 13A~13C illustrate some steps of the fabrication method of the conventional display unit.
Figure 13B:
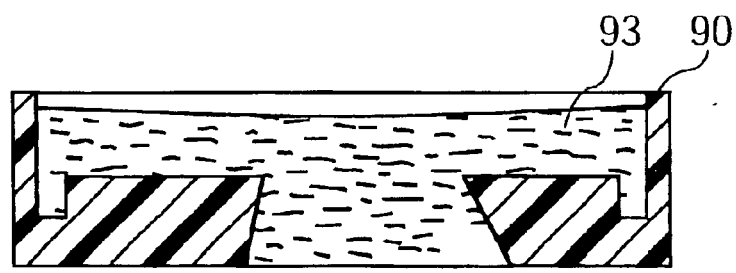
Figure 13C:
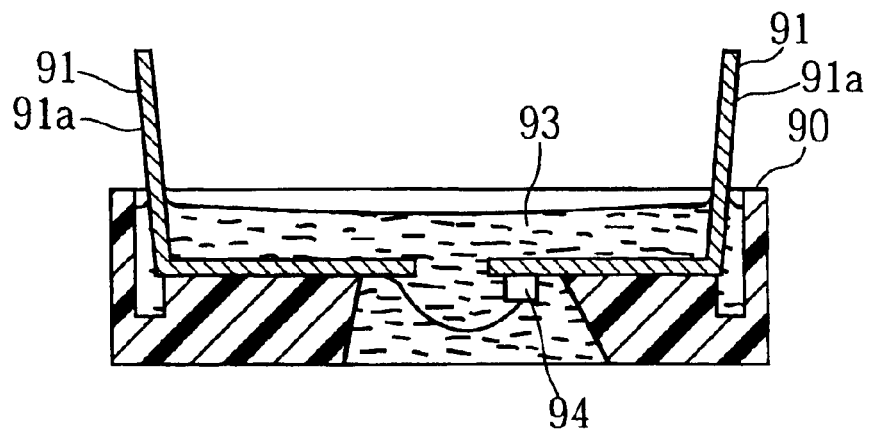

FIG. 11 shows the principal features of the lead 4 according to a fifth embodiment of the present invention. In this arrangement, the lead 4 is formed with a pair of recesses 47 in its surfaces opposite in the width or thickness direction of the lead 4. As seen from the figure, the horizontal barrier surfaces 43 of the relatively larger portion 42 interrupt the rising of the liquefied resin 2.

The above embodiments are only for illustrative purposes and should not be considered as limitative. For instance, the present invention can be applied not only to an 8 or 7-segment display unit but also to other types of illuminating units which may incorporate only one LED for example. Further, the present invention is applicable to semiconductor devices used for non-illuminating or non-information-displaying purposes.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A semiconductor device comprising:

a semiconductor element;

a housing that accommodates the semiconductor element, the housing having a hollow inner space and a bottom mounting surface;

a resin material filled within the hollow inner space of the housing short of the bottom mounting surface for enclosing the semiconductor element; and a lead that is connected to the semiconductor element and includes an inner portion embedded in the filled resin material and an outer portion protruding from the filled resin material;

wherein said outer portion is provided with an enlarged part positioned outside the filled resin material and including a barrier surface directed toward the filled resin material, the enlarged part being located between the bottom mounting surface of the housing and the filled resin material.

2. The device according to claim 1, wherein said outer portion includes a connection terminal that is farther from the resin material than the barrier surface is.

3. The device according to claim 2, wherein the connection terminal is smaller in width than the enlarged part.

4. The device according to claim 1, wherein the semiconductor element emits light, the housing being formed with an opening that allows passage of the emitted light.

* * * * *